United States Patent
Rosik et al.

(10) Patent No.: US 7,298,222 B2
(45) Date of Patent: *Nov. 20, 2007

(54) SYSTEMS AND METHOD FOR AUTOMATIC QUADRATURE PHASE IMBALANCE COMPENSATION USING A DELAY LOCKED LOOP

(75) Inventors: Ray Rosik, San Diego, CA (US); Weinan Gao, San Diego, CA (US); Mark Santini, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/460,298

(22) Filed: Jul. 27, 2006

(65) Prior Publication Data

US 2006/0256911 A1    Nov. 16, 2006

Related U.S. Application Data

(63) Continuation of application No. 11/096,214, filed on Mar. 31, 2005, now Pat. No. 7,123,103.

(51) Int. Cl.
*H03B 27/00* (2006.01)
*H03K 3/00* (2006.01)

(52) U.S. Cl. .......................................... 331/45; 327/238

(58) Field of Classification Search .................. 331/17, 331/18, 25, 45, 74, 175; 327/156–159, 233–236, 327/238, 240, 254–255

See application file for complete search history.

(56) References Cited

U.S. PATENT DOCUMENTS

| | | | |
|---|---|---|---|
| 5,027,124 A | * | 6/1991 | Fitzsimmons et al. ...... 342/362 |
| 5,150,128 A | | 9/1992 | Kongelbeck |
| 5,285,120 A | | 2/1994 | Landt |
| 5,608,796 A | | 3/1997 | Banu et al. |
| 5,644,260 A | | 7/1997 | DaSilva et al. |
| 5,694,093 A | * | 12/1997 | DaSilva et al. ............. 332/103 |
| 5,926,052 A | | 7/1999 | Dow et al. |
| 6,157,235 A | | 12/2000 | Bautista et al. |
| 6,313,680 B1 | | 11/2001 | Havens et al. |
| 6,628,343 B1 | * | 9/2003 | Yamaguchi et al. ......... 348/731 |
| 7,123,103 B1 | * | 10/2006 | Rosik et al. .................. 331/45 |

OTHER PUBLICATIONS

International Search Report for PCT/US2006/06807 dated Aug. 2, 2006.

* cited by examiner

*Primary Examiner*—David Mis
(74) *Attorney, Agent, or Firm*—Baker & McKenzie

(57) ABSTRACT

An automatic quadrature phase compensation system comprises an on-chip analog phase sense circuit capable of detecting small differences in quadrature phase error and providing a corresponding DC voltage, a voltage-controlled or programmable phase delay circuit to implement quadrature phase error correction, and a feedback system or compensation engine used to process the sensed error voltage and apply a corresponding correction signal to the adjustable phase delay.

43 Claims, 9 Drawing Sheets

SYSTEMS AND METHOD FOR AUTOMATIC QUADRATURE PHASE IMBALANCE COMPENSATION USING A DELAY LOCKED LOOP

RELATED APPLICATIONS INFORMATION

This application claims priority under 35 U.S.C. 120 as a continuation of U.S. patent application Ser. No. 11/096,214, entitled "Systems and Methods for Automatic Quadrature Phase Imbalance Compensation Using a Delay Locked Loop," filed Mar. 31, 2005 now U.S. Pat. No. 7,123,103, which is incorporated herein by reference as if set forth in full.

BACKGROUND

1. Field of the Invention

The device and methods described herein relate generally to transceivers requiring precision quadrature local oscillator (LO) signals.

2. Background

Many communications standards, for example, 802.11a/b/g for WLAN and DVBS2 for Digital Satellite TV, demand fully integrated transmitter and receiver architectures offering high performance at low cost. Direct conversion receivers and image-reject receivers are examples of such architectures. In these architectures, excellent phase and amplitude balance are critical to prevent quadrature inaccuracy from limiting the overall performance. In particular, inaccuracy in the phase and amplitude balance can result in poor image rejection.

In a receiver, image rejection refers to the receiver's ability to reject signals at its image frequency. In a transmitter, poor image rejection can produce an image signal that falls within the receive band of adjacent channels, which will interfere with devices operating on the adjacent channels. The image and desired inputs both mix with the Local Oscillator (LO) signal and are downconverted to the same frequency. This poses a problem in conventional double-balanced mixers because the two downconverted products interfere with each other, since they exit at the Intermediate Frequency (IF) output port together. Image rejection is thus defined as the ratio of the downconverted image signal power exiting at the IF output port, to that of the desired signal, exiting the same IF output port. For example, if the downconverted image and desired signal levels at are −30 dBm and −10 dBm respectively, then the image rejection is 20 dB. As mentioned, good image rejection requires close amplitude and phase matching.

Conventional double-balanced mixers use filters to block the image from entering the mixer. This prevents the mixer from generating a down-converted image signal. It will be understood, however, that as the IF is reduced, the desired and image signals move closer together in frequency, converging on the LO frequency, which limits the effectiveness of filtering and/or increases the complexity and cost of filtering solutions.

In comparison to conventional double-balanced mixers, image-rejection mixers, for example, achieve image-rejection through phase cancellation, not filtering, so the frequency spacing between the image and desired inputs can be negligible. Conventional image rejection receivers can achieve an image rejection ratio in the range of approximately 20-30 dB, which corresponds to a phase imbalance that can be as high as 10°. The standards referred to above, however, can require a phase accuracy of better than 1°. For example, such standards can require 60 dB of image rejection, which can require a phase imbalance that is as precise as 0.1°.

Phase accuracy in conventional receivers is often limited by the on-chip matching of devices within the quadrature generation circuit. Careful layout can help minimize phase inaccuracy; however, typical performance with good matching is still typically limited to ±3°. This corresponds to an Image Rejection Ratio (IRR) of less than 30 dB, which often results in a corrupted signal constellation and high bit error rate.

Given the mismatch limitations of conventional designs, successful implementation of the architectures referred to above requires additional phase calibration either inside the tuner included in the RF front end or inside the baseband demodulator circuit. Many conventional designs use the later approach to address the phase imbalance issue. The problem with such solutions, however, is that the RF front end and the baseband demodulator circuit are often produced by two different entities. As a result, the designer of the RF front end is faced with a dilemma. The designer can assume that the baseband circuit will include the requisite compensation and not include any compensation in the RF front end. But if the baseband circuit does not include sufficient compensation, then the receiver will not perform adequately. Thus, it can be preferable for the RF front end to include the requisite compensation, because it makes the RF front end independent of the baseband circuit. Alternatively, the system design may be forced to purchase both the baseband circuit and RF front end form the same supplier as part of a chip set solution, in order to ensure that the chip set has adequate compensation, which limits the designers' options. Further in an implementation of an RF frequency translation modular based on an RF-Analog Baseband-RF conversion architecture for emerging digital satellite TV broadcasting systems, it is imperative to have an analog method to generate an accurate quadrature LO signals for both RF to analog baseband conversion (receiver portion of the FTM modular) and analog baseband to RF conversion (transmitter portion of the FTM modular).

A few analog-based, front-end solutions have been proposed; however, none have implemented continuous phase error correction with <1° performance. One such solution is based on least-mean squared (LMS) algorithm. The main drawbacks of such solutions are increased power consumption, increased design complexity, and a one-time only calibration run at startup. Therefore, such designs require additional startup time and phase error performance may drift with temperature variation after power-up.

Another solution provides programmable amplitude and phase. The main drawback of such a solution is that they do not include an on-chip sense circuit or calibration engine. Therefore, such solutions still require support from the baseband circuit.

Still another solution generates N harmonics of the LO frequency using a high frequency delay locked loop. The main drawbacks of such an architecture are 1) it uses a frequency doubler for LO generation, 2) it increases phase noise on the LO, 3) it is not optimized for quadrature accuracy with phase error measured at ±5°. As a result, the performance can actually be worse than that achievable without a phase compensation system.

SUMMARY

An automatic quadrature phase compensation system comprises an on-chip analog sense circuit capable of detecting small differences in quadrature phase error and providing a corresponding DC voltage, a voltage-controlled or programmable phase delay circuit to implement quadrature phase error correction, and a feedback system or compensation engine used to process the sensed error voltage and apply a corresponding correction signal to the adjustable phase delay.

In one aspect, the automatic quadrature phase compensation system comprises a Phase Locked Loop (PLL) in which the quadrature phase difference between I and Q local oscillator signals is locked to 90°. Other aspects of the embodiments of the invention are further described in Exhibit A, appended to this application and incorporated herein by reference.

In another aspect, since the compensation PLL requires only phase adjustment and is not required to generate a frequency output, it can be simplified further into a Delay-Locked Loop (DLL). A DLL is a specific type of PLL used to synchronize clock edges, where the VCO is replaced by a voltage controlled delay line (VCDL).

These and other features, aspects, and embodiments of the disclosed are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

The systems and method described below relate to various embodiments and implementations for an automatic quadrature phase compensation system. The systems and methods described herein can apply equally to receivers and transmitters. While certain embodiments are described below, this should not be seen as limiting the systems and methods described herein to any particular embodiment, or implementation as it will be apparent that many variations are possible.

Figure 1:
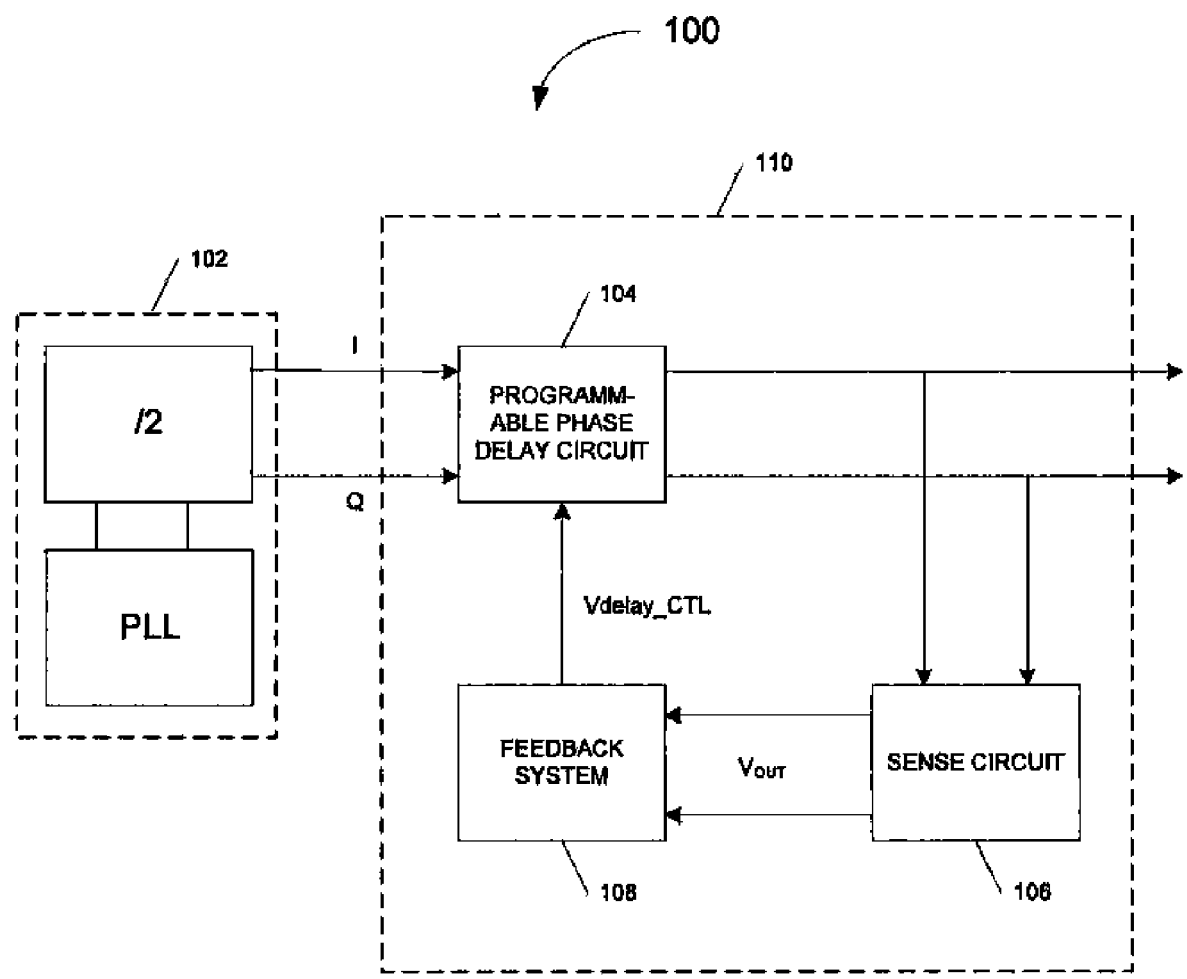
FIG. 1 is a diagram illustrating an example automatic quadrature phase compensation system configured in accordance with one embodiment.

FIG. 1 is a diagram illustrating an example automatic quadrature phase compensation system 100 configured in accordance with the systems and methods described herein. As can be seen, system 100 comprises a quadrature LO signal generator 102 configured to generate In-phase (I) and Quadrature phase (Q) signals, a voltage-controlled, or programmable phase delay circuit 104 configured to implement quadrature phase error correction on the quadrature signals generated by quadrature signal generator 102, an analog phase sense circuit 106 that is configured to receive phase information related to the I and Q signals and to produce a Direct Current (DC) voltage ($V_{OUT}$) that is representative of the sensed phase error, and a feedback system or compensation engine 108 configured to process the sensed error voltage ($V_{OUT}$) and apply a corresponding correction signal (Vdelay_CTL) to the phase delay circuit 104. Analog phase sense circuit 106 should be capable of detecting small phase errors, e.g., <0.5°, between the I and Q signals. As a result, the image rejection ratio can be above 50 dB for low IF receiver architectures.

Feedback system 108 can comprise an analog feedback system or a digital feedback system. Analog feedback systems are described in the embodiments below. A digital feedback system 108 can comprise a filter for filtering a signal generated by phase sense circuit 106, a sampling circuit, and an Analog-to-Digital (A/D) converter. The filtered signal can then be sampled by the sampling circuit and converted to a digital representation using an A/D converter. The generated digital representation can then be processed by a digital controller to set switches on a programmable delay circuit to adjust the delay accordingly.

One continuous implementation of phase compensation system 100 is equivalent to a Phase Locked Loop (PLL) in which the expected phase difference between I and Q local oscillator signals is locked to 90°. Thus, any variation from the expected 90° phase difference between I and Q local oscillator signals will be detected as a phase error by sense circuit 106. Since system 100 is only designed for phase adjustment and is not required to generate a varying frequency output, it can be simplified further into a Delay-Locked Loop (DLL). A DLL is a specific type of PLL used to synchronize clock edges, where a Voltage Controlled Oscillator (VCO), needed to produce such a varying frequency output, can be replaced by a Voltage Controlled Delay Line (VCDL). Certain DLL implementations are described in detail below.

Thus, quadrature local oscillator signal generation performed in accordance with the systems and methods described herein can be broken down into two parts: a coarse quadrature signal generation; and a refinement, or compensation, of the coarse quadrature signals to produce finely compensated quadrature signals. Coarse quadrature signal generation is accomplished via quadrature signal generator 102, which can, depending on the embodiment, be implemented in the form of a conventional divide-by-two circuit and corresponding PLL. Such divide-by-two circuits inherently generate I and Q outputs with phase accuracy approximately limited to the range of ±3°, based upon the matching of certain time delays associated with latches that comprise part of the divide-by-two circuit. The fine tune, calibration circuit can be implemented by loop 110 in FIG. 3.

It should be noted that some or all of the components in FIG. 1 can be combined into common circuits or blocks and can be packaged as part of the same integrated circuit or device, or can comprise separate circuits or devices. For example, analog sense circuit 106 and feedback system, or compensation engine 108 can, in certain embodiments, comprise part of a combined circuit or device. This combined circuit can then be on the same chip as the other components or can be on a separate chip interfaced with a chip, or chips, comprising the other components. Obviously, integration concerns can make it preferable to include all, or most of the components of FIG. 1 onto a single chip, or to integrate them within a single integrated circuit package.

Implementing the fine tune calibration circuit in the RF front end as an analog solution allows the RF front end to work with a variety of baseband demodulators as a stand alone product without a full chip set solution. Further, it makes re-transmission of the signal possible before demodulation. This makes possible potential applications in the implementation of a frequency translation module (FTM) for digital satellite television broadcast. Further, an analog solution configured in accordance with the systems and methods described herein can be configured to continuously correct for phase imbalance. Therefore, compensation provided is valid over temperature, supply voltage, mismatch, process variation, and LO frequency.

Figure 2:
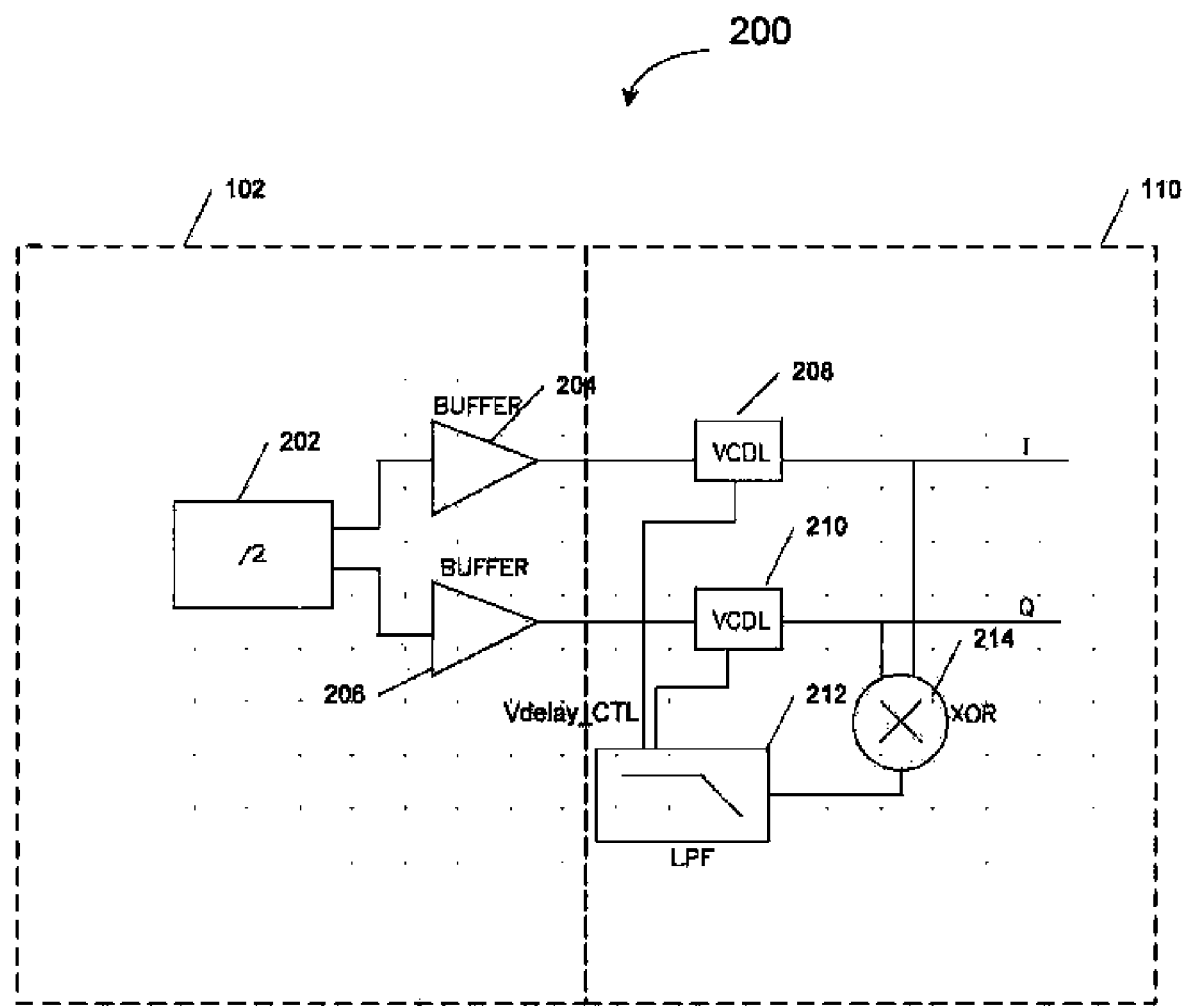
FIG. 2 is a diagram illustrating an example implementation of the system of FIG. 1 that includes a DLL.

As mentioned, loop 110 can take the form of a DLL. FIG. 2 is a diagram illustrating an example automatic quadrature phase compensation system 200 that comprises a DLL 110 configured in accordance with one embodiment of the systems and methods described herein. DLL 110 comprises a pair of VCDLs 208 and 210, a phase detector 214, and a loop filter 212. In this instance, phase detector 214 comprises an Exclusive-OR (XOR) device, but clearly, other phase detector implementations are possible and the use of an XOR device in the example of FIG. 2 should not be seen as limiting the systems and methods described herein to any particular implementation of a phase detector.

XOR 214 can be configured to provide a pulse width modulated (PWM) error voltage signal corresponding to the quadrature phase error between I and Q signals. Loop filter 212 can then translate the PWM error signal into a DC voltage corresponding to the phase error. Loop filter 212 can, for example, be implemented as a low pass filter; however, it will be clear that other implementations for loop filter 212 are also possible. The DC voltage generated by loop filter 212 can then be provided as the control voltage for VCDLs 208 and 210. As will be explained below, the control voltage controls VCDLs 208 and 210 so as to reduce the quadrature phase error between the I and Q signals.

Figure 3:
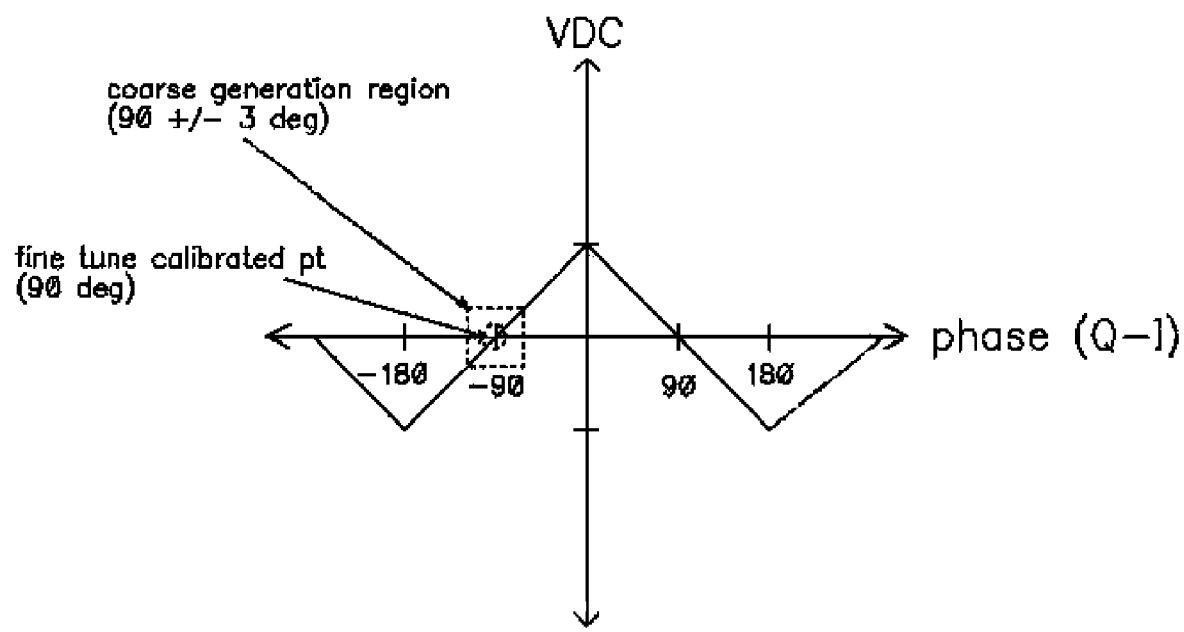
FIG. 3 is a diagram illustrating the filtered DC value of the PWM error voltage versus the phase difference between the LO quadrature signals.
Figure 4:
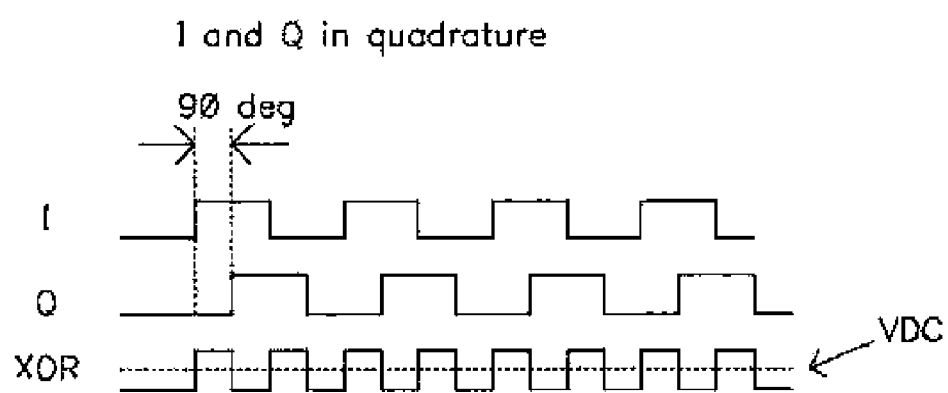
FIG. 4 is a timing diagram illustrating the timing of various signals in the DLL of FIG. 4.

FIG. 3 is a plot illustrating the average value of the DC error voltage produced by loop filter 212 versus the phase difference between the I and Q signals. As can be seen, the calibration point for the phase difference is locked at 90°. Thus, the absolute value of the DC error voltage (VDC) is zero when the phase error is zero and the phase difference between I and Q is exactly 90°. With DLL 110 locked at precisely 90°, the transient waveforms of the I and Q signals as well as VDC are illustrated in FIG. 4.

Figure 5:
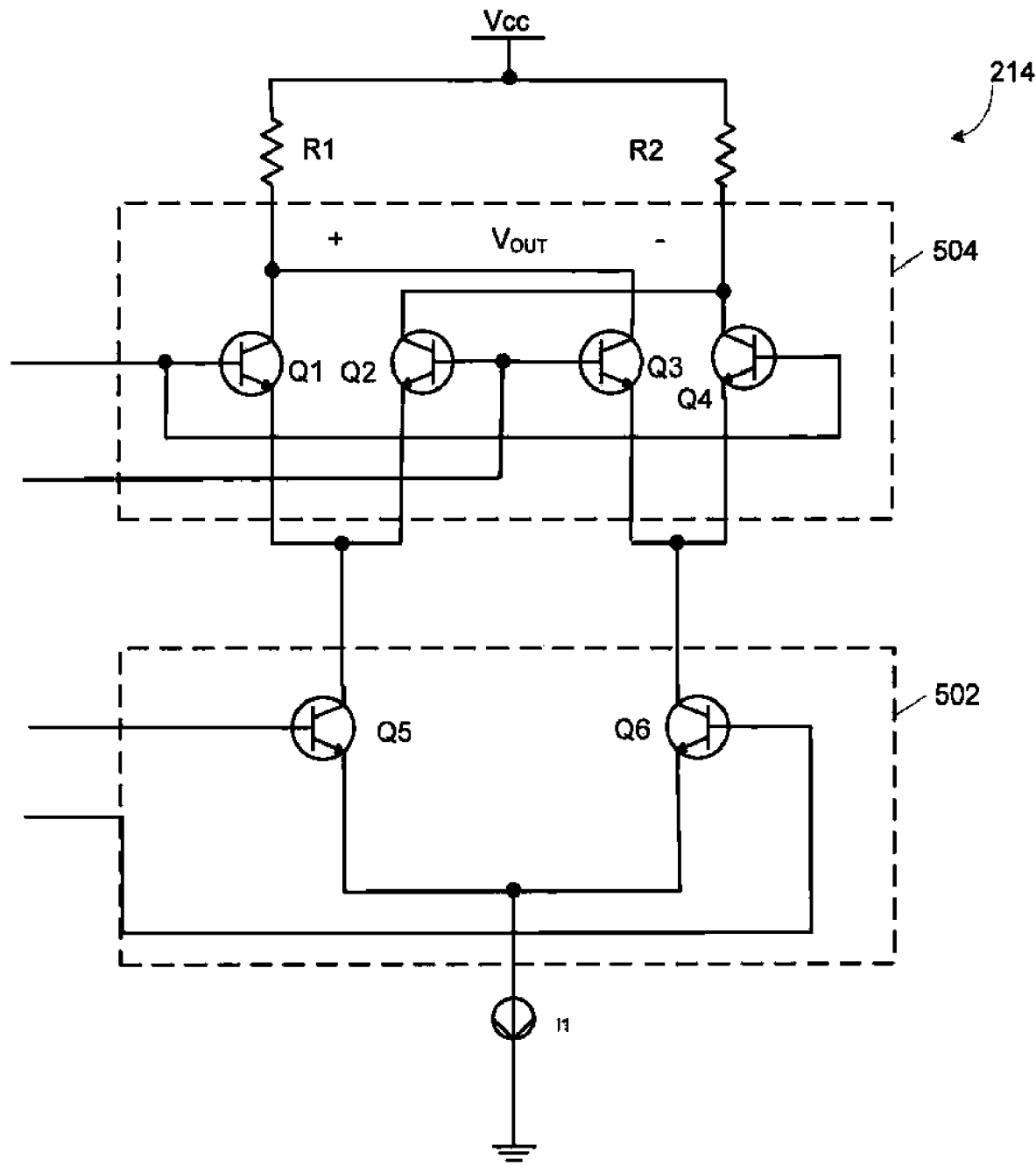
FIG. 5 is a schematic illustrating a specific circuit implementation for the phase error detector included in the DLL of FIG. 4.

FIG. 5 is a schematic illustrating an example implementation of XOR 214. In the example of FIG. 5, XOR 214 comprises a transconductor 502 and a switching pair 504. Transconductor 502 comprises device Q5 and Q6 that are configured to receive, in this case, a differential Q signal input, and to generate a current signal therefrom. The current signal is fed to switching pair 504, which comprises devices Q1-Q4. Switching pair 504 is driven by a differential I signal input to produce a voltage output ($V_{OUT}$) from the current signal provided by transconductor 502.

In the example of FIG. 5, the signal inputs and outputs are differential signals. Conversely, in FIG. 2, all signals are illustrated with a single line; however, the single line representation of FIG. 2 may or may not indicate that a given signal is a single ended signal. In fact, depending on the embodiment, all or some of the signals can be differential signals as in FIG. 5. Differential signals can be preferred, because their use eliminates, or reduces, the effect of any common mode errors, or noise. Specific implementations of DLL 110 that use differential signals and/or single ended signals are described more fully below.

Figure 6A:
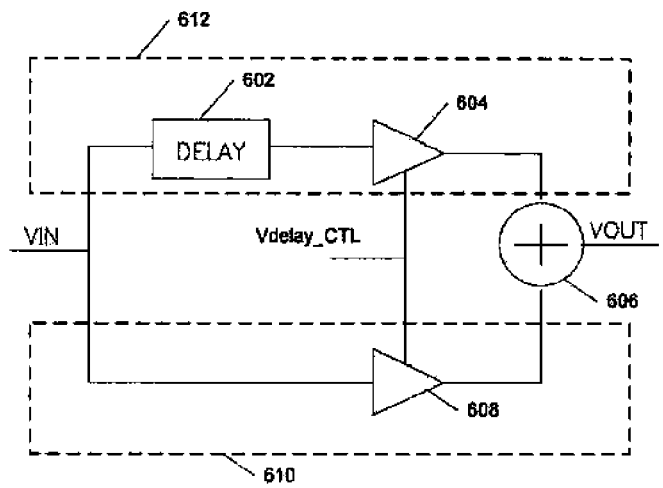
FIG. 6A is a diagram illustrating an example implementation of a VCDL included in the DLL of FIG. 1.

Many circuit topologies can be used for implementing VCDLs 208 and 210. FIG. 6A is a block diagram illustrating an example of VCDL implementation based on a phase interpolated circuit topology. VCDL 600 comprises a slow signal path 612 and a fast signal path 610. VCDL 600 is configured to generate a voltage controlled phase delay by interpolating between phases of the signals generated by slow signal path 612 and fast signal path 610. In FIG. 6, $V_{IN}$ represents an I or Q signal, which is fed to both slow signal path 612 and fast signal path 610. The interpolated delay is created by Vdelay_CTL which scales the gain coefficients of buffer 604 and 608. For the maximum delay, the gain of buffer 804 is equal to one while the gain of buffer 608 is zero. For the minimum delay, the gain of slow path buffer 604 is set to zero, while the fast gain path buffer is set to one. Interpolation of delays between the maximum and the minimum is achieved with analog scaling of the gain coefficients.

Figure 7:
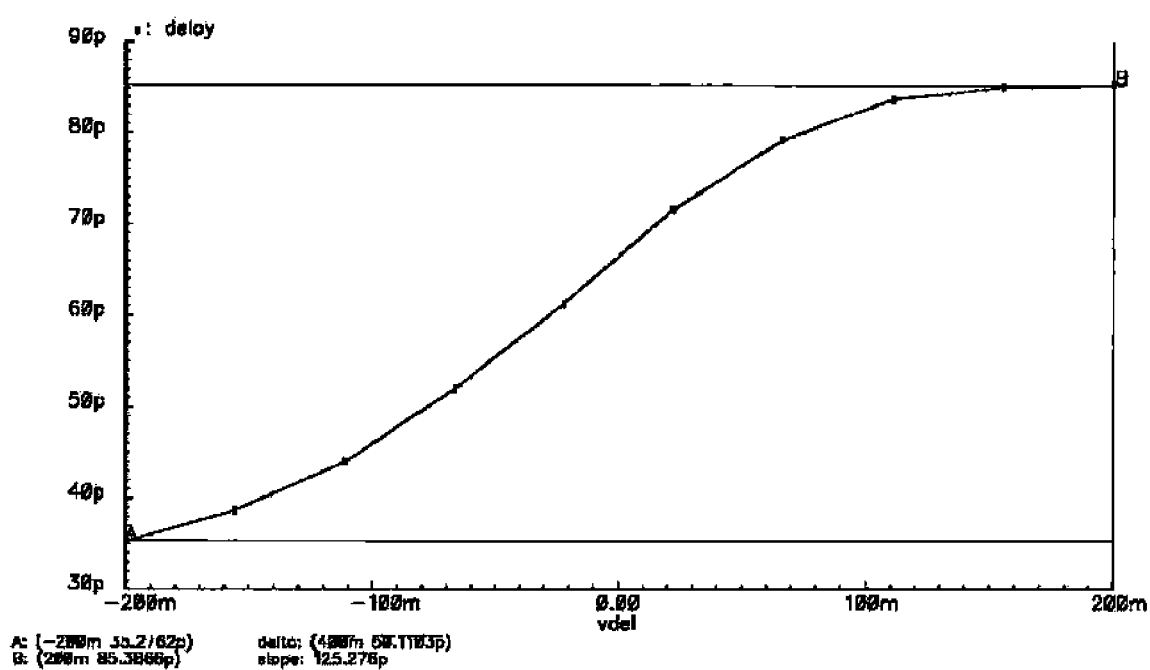
FIG. 7 is a diagram illustrating the time delay versus tuning voltage for the VCDL of FIG. 6A.

The output of delay controlled, slow signal path 612 is then combined with the output of fast signal path 610 in combiner 606. Therefore, the overall interpolated phase delay of the combined signal ($V_{OUT}$) can be controlled via the control of the gain coefficient on the buffers 604 and 608. In one embodiment, the delay can be adjusted from 35 ps to 85 ps for an input control voltage swing of 400 mV as illustrated by the graph of FIG. 7.

Figure 6B:
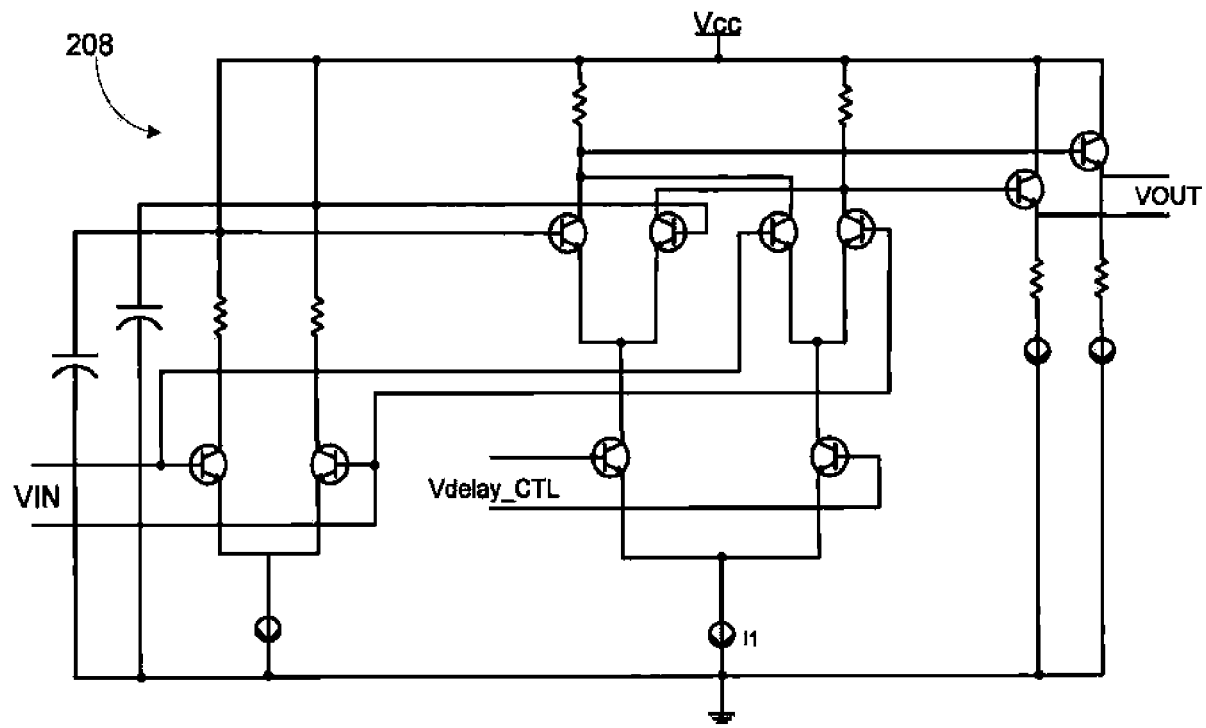
FIG. 6B is a schematic illustrating a specific circuit implementation for the VCDL of FIG. 6A.

In the example of FIG. 6, the signals are illustrated as single ended signals; however, some or all of the signals can in fact be differential signals, depending on the implementation. To illustrate this further, FIG. 6B is schematic depicting an example implementation of VCDL 600 that uses differential signals.

Thus referring back to FIG. 2, XOR 214 can be configured to detect even very small phase differences between the I and Q signals and to generate a DC voltage signal that is proportionate to the phase error detected. Loop filter 212 can be configured to filter the DC voltage and generate a corresponding tuning voltage (Vdelay_CTL) that is sent to VCDL 208 and/or 210. $V_{TUNE}$ is then used by VCDL 208 and/or 210 to control the phase of the corresponding I or Q signal so as to eliminate the phase error. In other words, $V_{TUNE}$ can be used to push or pull the phase of one or both of the I or Q signals in a manner that eliminates the phase error between the two.

Figure 8:
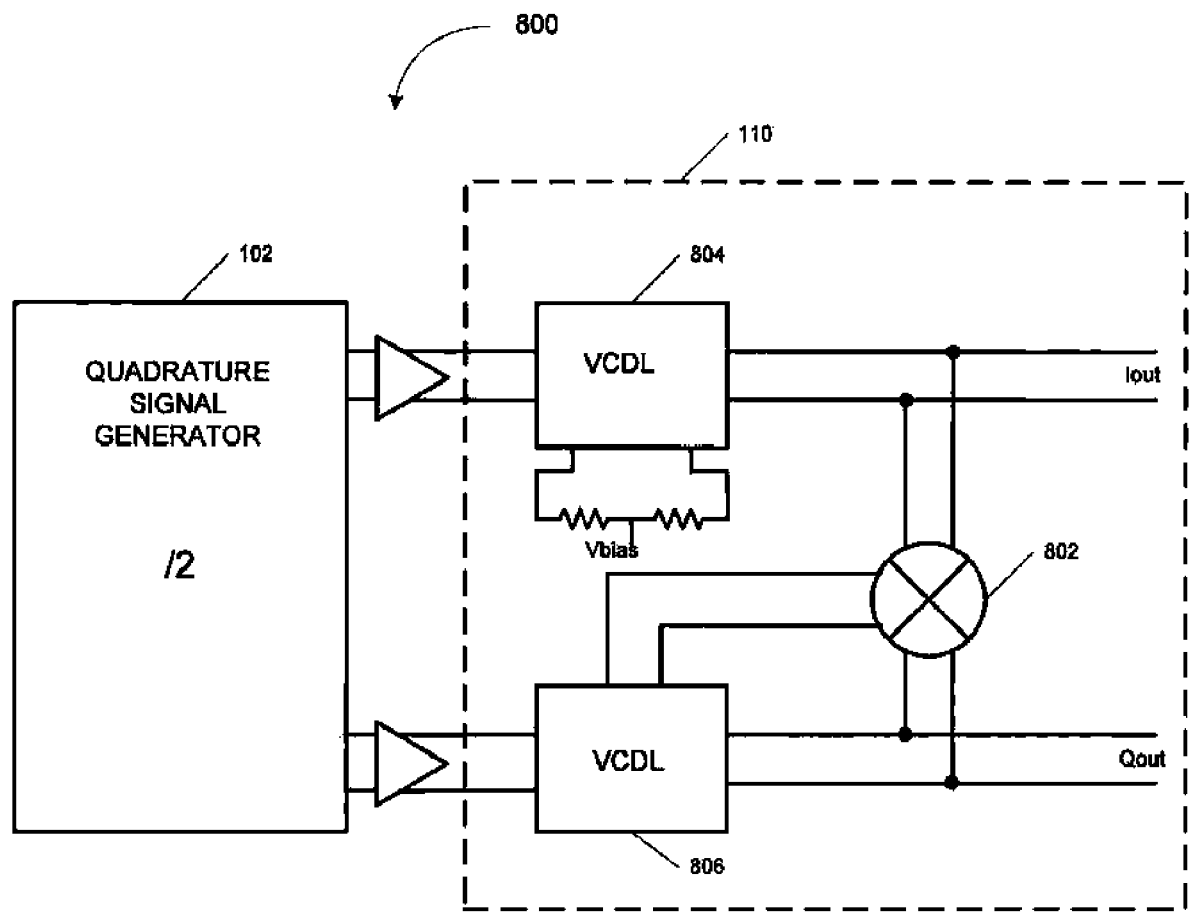
FIG. 8 is a diagram illustrating an example automatic quadrature phase compensation system that includes a differential DLL in accordance with one embodiment.

For example, FIG. 8 is a diagram illustrating an example automatic quadrature phase compensation system 800 in which the tuning voltage is only supplied to one of the VCDLs. Automatic quadrature phase compensation system 800 comprises a quadrature signal generator 102 and a differential DLL 110. Differential DLL 110 comprises a differential error detector 802 configured to sense the phase error between the I and Q signals and to generate a differential tuning voltage that is supplied to VCDL 806 in order to push and/or pull the phase of the Q signal as need to eliminate the phase error relative to the I signal. Meanwhile, VCDL 804 is simply biased at a set point, e.g., in the middle of the tuning range and remains unchanged. In other words, all of the tuning occurs on the Q signal.

It will be clear that in other embodiments, all of the tuning can be allowed to occur on the I signal, while the Q signal remains unchanged, i.e., VCDL 806 is biased to a specified set point. Further, while not shown, DLL 110 can comprise a loop filter, such as loop filter 212.

Figure 9:
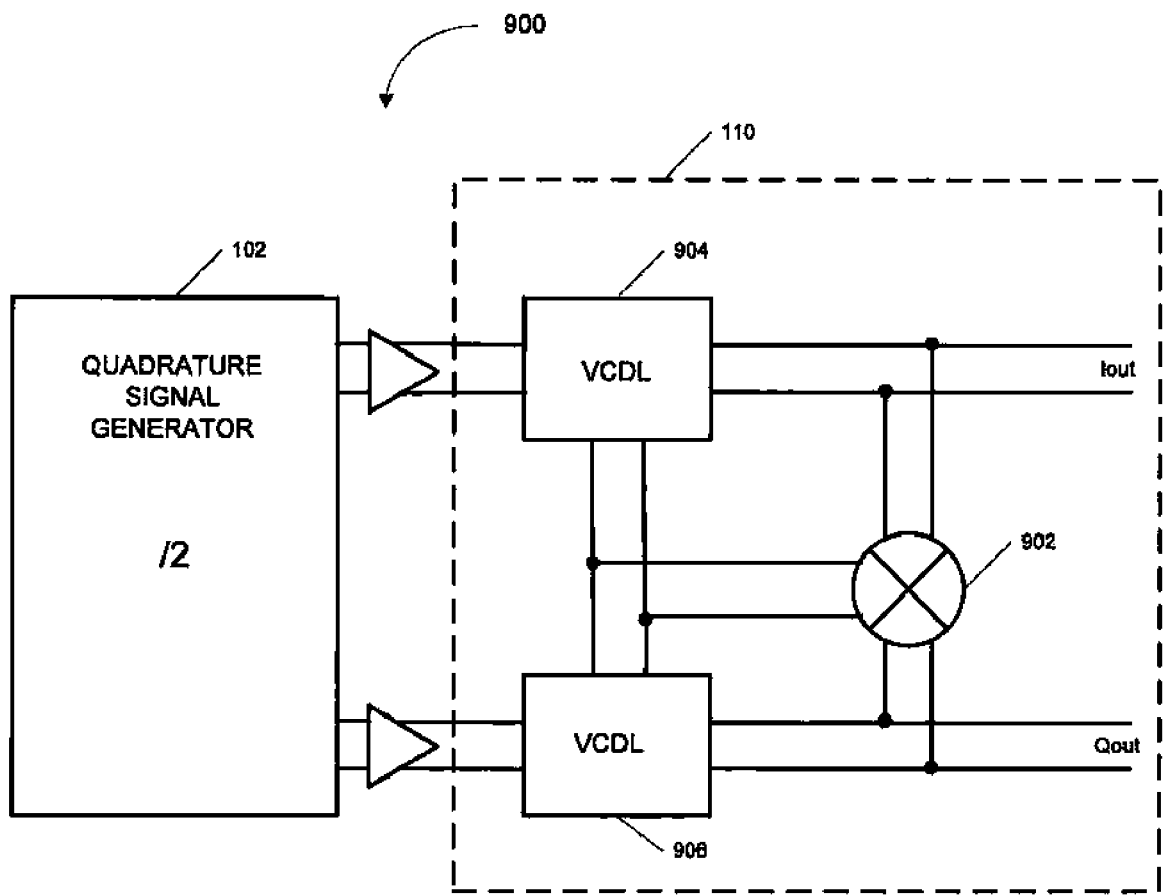
FIG. 9 is a diagram illustrating an example automatic quadrature phase compensation system that includes a differential DLL in accordance with another embodiment.

FIG. 9, on the other hand, is a diagram illustrating an example automatic quadrature phase compensation system 900, in which DLL 110 is implemented as a differential DLL and in which the phase of both the I and Q signals are controlled via error detector 902.

Figure 10:
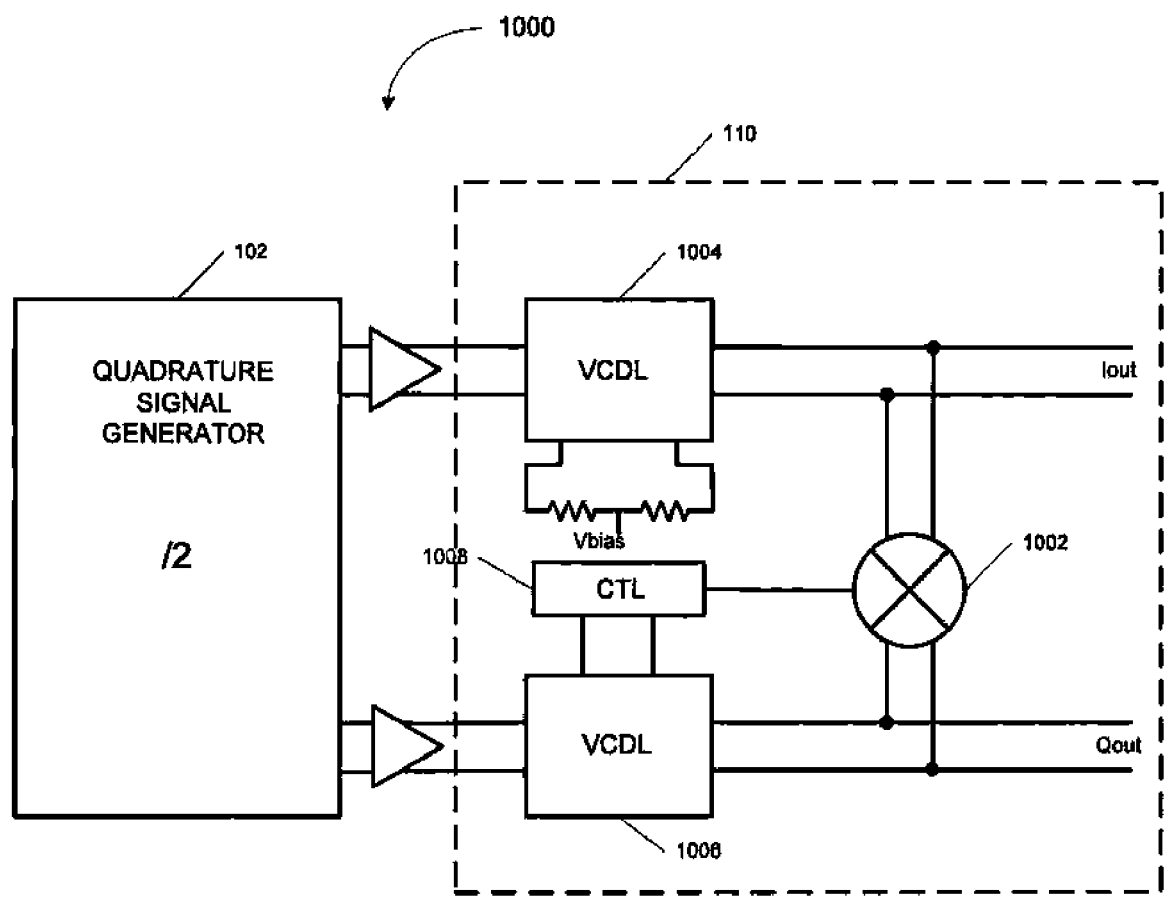
FIG. 10 is a diagram illustrating an example automatic quadrature phase compensation system that includes a single ended DLL in accordance with one embodiment.

FIG. 10 is a diagram illustrating an example automatic quadrature phase compensation system 1000 in which DLL 110 is implemented as a single ended DLL. Thus, error detector 1002 is configured to sense the phase error between the I and Q signals and generate a single ended tuning signal (Vdelay_CTL). The single ended tuning signal is fed to CTL circuit 1008, which converts the single ended tuning signal into a differential tuning signal that can be applied to VCDL 1006 in order to control the phase of the Q signal. It will be clear that in other implementations, the single ended tuning signal can be used to control the phase of the I signal, via VCDL 1004, or both the Q and I signals.

An analog solution configured in accordance with the systems and methods described herein requires very low current, as the only extra blocks consuming current are the phase detector and an extra stage of the I/Q buffer(s) for implementing the VCDLs. Moreover, the solutions described can implement phase imbalance compensation directly on the quadrature circuit of the LO, thereby preventing any degradation in the quadrature amplitude matching of the receiver.

An automatic quadrature phase compensation system 100, such as described herein, can be included in a variety of devices. Such devices can include a settop box, television, satellite receiver, or a tuner, to name just a few.

While certain embodiments and/or implementations of the inventions have been described above, it will be understood that the embodiments described are by way of example only. Accordingly, the inventions should not be limited based on the described embodiments. For example, it will be clear that the systems and methods can be applied to any communication architecture that requires a precision quadrature LO, whether in the receiver or the transmitter. Rather, the scope of the inventions described herein should only be limited in light of the claims that follow when taken in conjunction with the above description and accompanying drawings.

What is claimed is:

1. A quadrature phase compensation system, comprising:
   at least one controllable phase delay circuit configured to implement quadrature phase error correction on quadrature signals generated by a quadrature signal generator;
   at least one second circuit coupled with the phase delay circuit, the second circuit configured to receive the quadrature signals from said at least one phase delay circuit, sense a phase error related to the quadrature signals, and produce a signal that is representative of the sensed error; and
   at least one feedback circuit coupled between said at least one second circuit and said at least one phase delay circuit, said feedback circuit configured to process a delta signal and apply a corresponding correction signal to said at least one phase delay circuit.

2. The quadrature phase compensation system of claim 1, wherein the at least one second circuit comprises an analog phase sense circuit, and wherein the analog phase sense circuit is configured to detect phase errors that are less than about 0.5°.

3. The quadrature phase compensation system of claim 1, wherein the at least one controllable phase delay circuit comprises a voltage-controlled, phase delay circuit.

4. The quadrature phase compensation system of claim 3, wherein the voltage-controlled, phase delay circuit comprises a VCDL.

5. The quadrature phase compensation system of claim 1, wherein the analog sense circuit comprises an XOR circuit.

6. The quadrature phase compensation system of claim 5, wherein the XOR circuit comprises a differential XOR.

7. The quadrature phase compensation system of claim 5, wherein the XOR circuit comprises a single-ended XOR.

8. The quadrature phase compensation system of claim 1, wherein the at least one feedback circuit comprises a filter.

9. The quadrature phase compensation system of claim 8, wherein the filter is a low pass filter.

10. The quadrature phase compensation system of claim 1, wherein the at least one controllable phase delay circuit is configured to adjust the phase of the in-phase signal of the quadrature signals in order to implement the quadrature phase error correction.

11. The quadrature phase compensation system of claim 1, wherein the at least one controllable phase delay circuit is configured to adjust the phase of the quadrature phase signal of the quadrature signals in order to implement the quadrature phase error correction.

12. The quadrature phase compensation system of claim 1, wherein the at least one controllable phase delay circuit is configured to adjust the phase of both the in-phase and quadrature signals in order to implement the quadrature phase error correction.

13. The quadrature phase compensation system of claim 1, further comprising a quadrature signal generator.

14. The quadrature phase compensation system of claim 13, wherein the quadrature signal generator comprises a divide-by-two circuit.

15. A receiver, comprising:
   a quadrature signal generator configured to generate in-phase and quadrature signals;
   an in-phase VCDL coupled with the quadrature signal generator and configured to implement quadrature phase error correction on the in-phase signal generated by the quadrature signal generator;
   a quadrature phase VCDL coupled with the quadrature signal generator and configured to implement quadrature phase error correction on the quadrature phase signal generated by the quadrature signal generator;
   an analog sense circuit coupled with the in-phase and quadrature phase VCDLs, the analog sense circuit configured to receive the in-phase and quadrature phase signals from the VCDLs, sense a phase error related to the signals, and produce a DC voltage that is representative of the sensed phase error; and
   a feedback system coupled between the analog sense circuit and the in-phase VCDL, the feedback system configured to process the DC voltage and apply a corresponding correction signal to the in-phase VCDL.

16. The receiver of claim 15, wherein the feedback system is coupled to the in-phase and quadrature-phase VCDLs.

17. The receiver of claim 15, wherein the quadrature signal generator comprises a divide-by-two circuit.

18. A transmitter, comprising:
a quadrature signal generator configured to generate in-phase and quadrature signals;
an in-phase VCDL coupled with the quadrature signal generator and configured to implement quadrature phase error correction on the in-phase signal generated by the quadrature signal generator;
a quadrature phase VCDL coupled with the quadrature signal generator and configured to implement quadrature phase error correction on the quadrature phase signal generated by the quadrature signal generator;
an analog sense circuit coupled with the in-phase and quadrature phase VCDLs, the analog sense circuit configured to receive the in-phase and quadrature phase signals from the VCDLs, sense a phase error related to the signals, and produce a DC voltage that is representative of the sensed phase error; and
a feedback system coupled between the analog sense circuit and at least on of the VCDLs, the feedback system configured to process the DC voltage and apply a corresponding correction signal to at least one of the VCDLs.

19. The transmitter of claim 18, wherein the analog sense circuit is configured to detect phase errors that are less than about 0.5°.

20. The transmitter of claim 18, wherein the analog sense circuit comprises an XOR circuit.

21. The transmitter of claim 20, wherein the XOR circuit comprises a differential XOR.

22. The transmitter of claim 20, wherein the XOR circuit comprises a single-ended XOR.

23. The transmitter of claim 18, wherein the feedback system comprises a filter.

24. The transmitter of claim 23, wherein the filter is a low pass filter.

25. The transmitter of claim 18, wherein the feedback system is coupled to the in-phase VCDL.

26. The transmitter of claim 18, wherein the feedback system is coupled to the quadrature-phase VCDL.

27. The transmitter of claim 18, wherein the feedback system is coupled to the in-phase and quadrature-phase VCDLs.

28. The transmitter of claim 18, wherein the quadrature signal generator comprises a divide-by-two circuit.

29. The quadrature phase compensation system of claim 18, wherein the feedback system is implemented using an A/D followed by a state machine and a discretely programmable delay circuit.

30. A quadrature phase compensation system, comprising:
a voltage-controlled, phase delay means for implementing quadrature phase error correction on quadrature signals generated by a quadrature signal generator;
an analog phase sense means for receiving the quadrature signals from the voltage-controlled, phase delay means, sensing a phase error related to the quadrature signals, and producing a DC voltage that is representative of the sensed phase error; and
a feedback means for processing the DC voltage and applying a corresponding correction signal to the voltage-controlled, phase delay circuit.

31. The quadrature phase compensation system of claim 30, wherein the analog sense means is for detecting phase errors that are less than about 0.5°.

32. The quadrature phase compensation system of claim 30, wherein the analog sense means is a differential analog sense means.

33. The quadrature phase compensation system of claim 30, wherein the feedback means comprises a filter means for filtering a signal received form the analog sense means.

34. The quadrature phase compensation system of claim 33, wherein the filter means is a low pass filter means.

35. The quadrature phase compensation system of claim 30, wherein the voltage-controlled, phase delay means adjusts the phase of the in-phase signal of the quadrature signals in order to implement the quadrature phase error correction.

36. The quadrature phase compensation system of claim 30, wherein the voltage-controlled, phase delay means adjusts the phase of the quadrature phase signal of the quadrature signals in order to implement the quadrature phase error correction.

37. The quadrature phase compensation system of claim 30, wherein the voltage-controlled, phase delay means adjusts the phase of both the in-phase and quadrature signals in order to implement the quadrature phase error correction.

38. The quadrature phase compensation system of claim 30, further comprising a means for generating a quadrature signal.

39. The quadrature phase compensation system of claim 38, wherein the means for generating a quadrature signal comprises a divide-by-two circuit.

40. A set-top box comprising a quadrature phase compensation system, the quadrature phase compensation system, comprising:
a voltage-controlled, phase delay circuit configured to implement quadrature phase error correction on quadrature signals generated by a quadrature signal generator;
an analog phase sense circuit coupled with the voltage controlled, phase delay circuit, the analog phase sense circuit configured to receive the quadrature signals from the voltage-controlled, phase delay circuit, sense a phase error related to the quadrature signals, and produce a DC voltage that is representative of the sensed phase error; and
a feedback system coupled between the analog phase sense circuit and the voltage-controlled, phase delay circuit, the feedback system configured to process the DC voltage and apply a corresponding correction signal to the voltage-controlled, phase delay circuit.

41. A television comprising a quadrature phase compensation system, the quadrature phase compensation system, comprising:
a voltage-controlled, phase delay circuit configured to implement quadrature phase error correction on quadrature signals generated by a quadrature signal generator;
an analog phase sense circuit coupled with the voltage controlled, phase delay circuit, the analog phase sense circuit configured to receive the quadrature signals from the voltage-controlled, phase delay circuit, sense a phase error related to the quadrature signals, and produce
a DC voltage that is representative of the sensed phase error; and
a feedback system coupled between the analog phase sense circuit and the voltage-controlled, phase delay circuit, the feedback system configured to process the DC voltage and apply a corresponding correction signal to the voltage-controlled, phase delay circuit.

42. A tuner comprising a quadrature phase compensation system, the quadrature phase compensation system, comprising:

a voltage-controlled, phase delay circuit configured to implement quadrature phase error correction on quadrature signals generated by a quadrature signal generator;

an analog phase sense circuit coupled with the voltage controlled, phase delay circuit, the analog phase sense circuit configured to receive the quadrature signals from the voltage-controlled, phase delay circuit, sense a phase error related to the quadrature signals, and produce a DC voltage that is representative of the sensed phase error; and a feedback system coupled between the analog phase sense circuit and the voltage-controlled, phase delay circuit, the feedback system configured to process the DC voltage and apply a corresponding correction signal to the voltage-controlled, phase delay circuit.

43. A satellite receiver comprising a quadrature phase compensation system, the quadrature phase compensation system, comprising:

a voltage-controlled, phase delay circuit configured to implement quadrature phase error correction on quadrature signals generated by a quadrature signal generator;

an analog phase sense circuit coupled with the voltage controlled, phase delay circuit, the analog phase sense circuit configured to receive the quadrature signals from the voltage-controlled, phase delay circuit, sense a phase error related to the quadrature signals, and produce a DC voltage that is representative of the sensed phase error; and a feedback system coupled between the analog phase sense circuit and the voltage-controlled, phase delay circuit, the feedback system configured to process the DC voltage and apply a corresponding correction signal to the voltage-controlled, phase delay circuit.

\* \* \* \* \*